US012593603B2

(12) United States Patent
Zhang et al.

(10) Patent No.: US 12,593,603 B2
(45) Date of Patent: Mar. 31, 2026

(54) DISPLAY SUBSTRATE AND DISPLAY DEVICE

(71) Applicant: BOE Technology Group Co., Ltd., Beijing (CN)

(72) Inventors: Xiaojin Zhang, Beijing (CN); Siqi Wang, Beijing (CN); Haiyan Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 922 days.

(21) Appl. No.: 17/794,628

(22) PCT Filed: Aug. 30, 2021

(86) PCT No.: PCT/CN2021/115472
§ 371 (c)(1),
(2) Date: Mar. 9, 2023

(87) PCT Pub. No.: WO2023/028788
PCT Pub. Date: Mar. 9, 2023

(65) Prior Publication Data
US 2024/0206296 A1      Jun. 20, 2024

(51) Int. Cl.
*H10K 59/80* (2023.01)
*H10K 59/50* (2023.01)
(Continued)

(52) U.S. Cl.
CPC ......... *H10K 59/8791* (2023.02); *H10K 59/50* (2023.02); *H10K 59/879* (2023.02); *H10K 85/111* (2023.02); *H10K 2102/351* (2023.02)

(58) Field of Classification Search
CPC .. H10K 59/8791; H10K 59/50; H10K 59/879; H10K 59/8793; H10K 85/111; H10K 2102/351
See application file for complete search history.

(56) References Cited

U.S. PATENT DOCUMENTS

| 11,513,395 B1 * | 11/2022 | Kodama | ............... | G01J 1/0437 |
| 2003/0127656 A1 * | 7/2003 | Aizawa | .................. | H10K 50/86 |
| | | | | 257/79 |

(Continued)

FOREIGN PATENT DOCUMENTS

| CN | 101777289 A | 7/2010 |
| CN | 105590948 A | 5/2016 |

(Continued)

OTHER PUBLICATIONS

European Search Report for 21955367.4 Mailed Apr. 17, 2024.

*Primary Examiner* — Fernando L Toledo
*Assistant Examiner* — Marshall Mu-Nuo Hatfield
(74) *Attorney, Agent, or Firm* — Ling Wu; Stephen Yang; Ling and Yang Intellectual Property

(57) ABSTRACT

A display substrate includes a light emitting element disposed on a base substrate, and a light dimming structure layer and an anti-reflection layer stacked sequentially at a light exiting side of the light emitting element, wherein the light dimming structure layer includes a polarizing film layer configured to convert at least a portion of light emitted by the light emitting element incident onto the polarizing film layer into circularly polarized light with a set rotational direction to pass through the polarizing film layer; the anti-reflection layer includes a phase retarder and a linear polarizer which are stacked sequentially along a direction away from the base substrate, the phase retarder being configured to convert the circularly polarized light passing through the polarizing film layer into linearly polarized light, a polarization direction of which is parallel to a direction of a light transmission axis of the linear polarizer.

17 Claims, 3 Drawing Sheets

(51) Int. Cl.
  *H10K 85/10* (2023.01)
  *H10K 102/00* (2023.01)

(56) References Cited

U.S. PATENT DOCUMENTS

| | | | |
|---|---|---|---|
| 2010/0177265 A1* | 7/2010 | Jung | H10K 59/8791 |
| | | | 349/98 |
| 2010/0182552 A1 | 7/2010 | Park et al. | |
| 2016/0133880 A1 | 5/2016 | Lee et al. | |
| 2017/0125743 A1 | 5/2017 | Kim et al. | |
| 2017/0213876 A1* | 7/2017 | Ohsawa | H10K 50/17 |
| 2018/0143361 A1 | 5/2018 | Yakabe | |
| 2019/0378883 A1* | 12/2019 | Yu | G02B 5/3016 |
| 2020/0020889 A1 | 1/2020 | Muramatsu et al. | |
| 2020/0212130 A1 | 7/2020 | Kim et al. | |
| 2020/0225521 A1* | 7/2020 | Lee | G02F 1/133606 |
| 2020/0381665 A1* | 12/2020 | Song | H10K 59/879 |
| 2020/0403187 A1* | 12/2020 | Saitoh | H10K 59/50 |
| 2021/0043865 A1 | 2/2021 | Bai | |
| 2021/0234098 A1* | 7/2021 | Lee | H10K 50/156 |
| 2022/0310969 A1 | 9/2022 | Fan et al. | |

FOREIGN PATENT DOCUMENTS

| | | | | |
|---|---|---|---|---|
| CN | 107037522 A | 8/2017 | | |
| CN | 107533183 A | 1/2018 | | |
| CN | 110571346 A | 12/2019 | | |
| CN | 111081747 A | 4/2020 | | |
| CN | 111384128 A | 7/2020 | | |
| CN | 112310308 A | 2/2021 | | |
| CN | 112542494 A | 3/2021 | | |
| CN | 113036061 A | * 6/2021 | | H10K 59/879 |

\* cited by examiner

DISPLAY SUBSTRATE AND DISPLAY DEVICE

CROSS-REFERENCE TO RELATED APPLICATION

The present application is a U.S. National Phase Entry of International Application PCT/CN2021/115472 having an international filing date of Aug. 30, 2021 and entitled "Display Substrate and Display Device", and the contents disclosed in the above-mentioned application are hereby incorporated as a part of this application.

TECHNICAL FIELD

Embodiments of the present disclosure relate to, but are not limited to, the field of display technologies, and more particularly to a display substrate and a display device.

BACKGROUND

Due to use of electrodes with strong reflection character-istics, strong reflection of external light in a bright field of view will decrease the contrast of some organic light emit-ting diode (OLED) display panels greatly. Anti-reflection optical structures are usually used for improving visuality of the panels. However, linear polarizers are contained in commonly used anti-reflection film layer structures, result-ing in a great loss (no less than 50%) in luminance of the panels and further causing many problems such as increased power consumption and loss of service life.

SUMMARY

The following is a summary of subject matters described herein in detail. The summary is not intended to limit the protection scope of the claims.

An embodiment of the present disclosure provides a display substrate, which includes a light emitting element disposed on a base substrate, and a light dimming structure layer and an anti-reflection layer sequentially stacked at a light exiting side of the light emitting element, wherein the light dimming structure layer includes a polarizing film layer configured to convert at least a portion of light which is emitted by the light emitting element and incident onto the polarizing film layer into circularly polarized light with a set rotational direction to pass through the polarizing film layer; the anti-reflection layer includes a phase retarder and a linear polarizer which are stacked sequentially along a direction away from the base substrate, the phase retarder is config-ured to convert the circularly polarized light passing through the polarizing film layer into linearly polarized light, a polarization direction of the phase retarder is parallel to a direction of a light transmission axis of the linear polarizer.

An embodiment of the present disclosure further provides a display device including the display substrate described above.

Other aspects may become clear upon reading and under-standing of the drawings and the detailed description.

BRIEF DESCRIPTION OF DRAWINGS

The drawings are intended to provide a further under-standing of technical solutions of the present disclosure and form a part of the specification, and are used to explain the technical solutions of the present disclosure together with embodiments of the present disclosure, and not intended to form limitations on the technical solutions of the present disclosure. Shapes and sizes of various components in the drawings do not reflect actual scales, and are only intended to schematically illustrate the contents of the present dis-closure.

REFERENCE NUMBERS

101 base substrate, 102 driving circuit layer, 103 light emitting structure layer, 210 driving transistor, 211 storage capacitor;

301 anode, 302 hole injection layer, 303 hole transport layer, 3041 electron block layer of red sub-pixel, 3042 electron block layer of green sub-pixel, 3043 electron block layer of blue sub-pixel, 3051 light emitting layer of red sub-pixel, 3052 light emitting layer of green sub-pixel, 3053 light emitting layer of blue sub-pixel, 306 hole block layer, 307 electron transport layer, 308 electron injection layer, 309 cathode;

310 light emitting element, 311 organic functional layer, 510 pixel definition layer;

60 composite structure layer, 61 capping layer, 62 encap-sulation layer, 70 polarizing film layer, 80 anti-reflec-tion layer, 81 phase retarder, 82 linear polarizer.

DETAILED DESCRIPTION

Those of ordinary skills in the art should understand that modifications or equivalent replacements may be made to the technical solutions of the embodiments of the present disclosure without departing from the spirit and scope of the technical solutions of the embodiments of the present dis-closure, and should all fall within the scope of the claims of the present disclosure.

Figure 1:
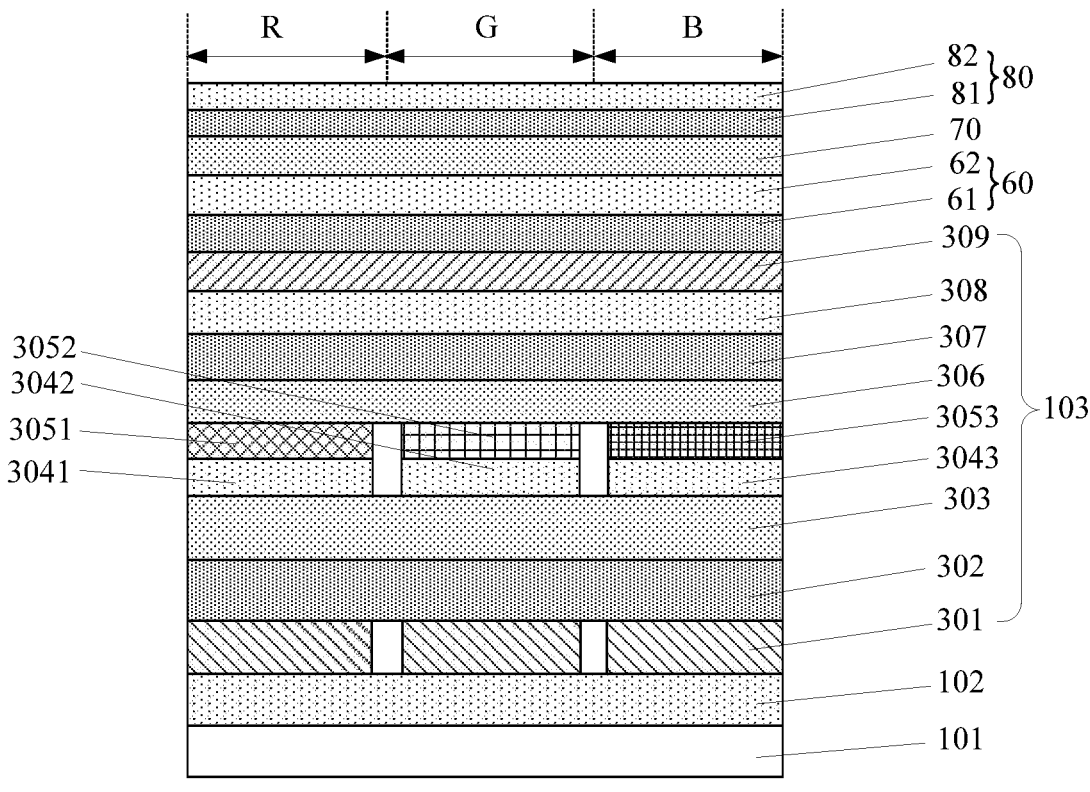
FIG. 1 is a schematic diagram of a film layer structure of a display substrate according to some exemplary embodi-ments.
Figure 2:
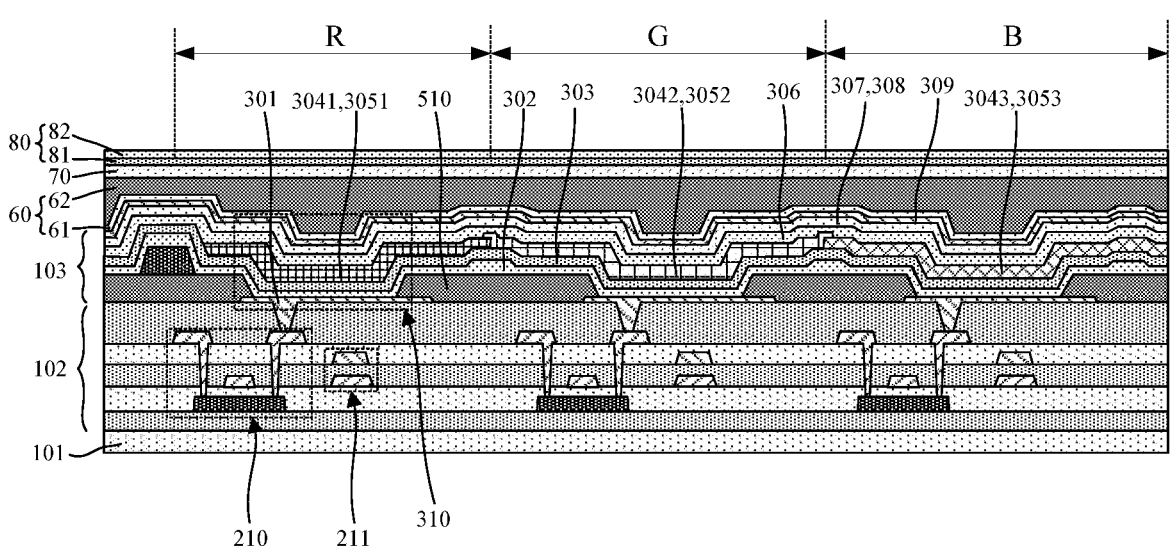
FIG. 2 is a schematic view of a cross-sectional structure of a display substrate according to some exemplary embodi-ments.
Figures 3, 4:
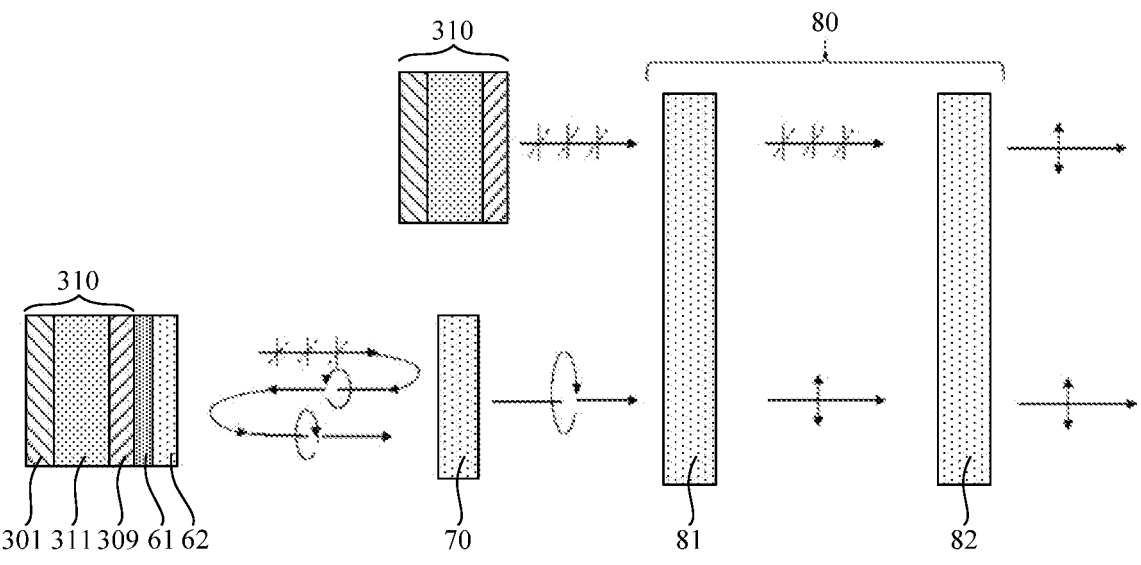
FIG. 3 is a schematic diagram showing that light emitted by a light emitting element of a display substrate passes through a light dimming structure layer and an anti-reflec-tion layer sequentially, according to some exemplary embodiments.
FIG. 4 is a graph of transmittance of an R-CLC layer to visible light with different wavelengths in a display substrate according to some exemplary embodiments.

An embodiment of the present disclosure provides a display substrate. As shown in FIGS. 1, 2 and 3, FIG. 1 is a schematic diagram of a film layer structure of a display substrate according to some exemplary embodiments. FIG. 2 is a schematic view of a cross-sectional structure of a display substrate according to some exemplary embodi-ments. FIG. 3 is a schematic diagram showing that light emitted by a light emitting element of a display substrate passes through a light dimming structure layer and an anti-reflection layer sequentially according to some exem-plary embodiments. The display substrate includes a light emitting element 310 (shown in FIG. 2) disposed on a base substrate 101, and a light dimming structure layer and an anti-reflection layer 80 stacked at a light exiting side of the light emitting element 310 sequentially. The dimming structure layer includes a polarizing film layer 70 configured to convert at least a portion of light which is emitted by the light emitting element 310 and incident onto the polarizing film layer 70 into circularly polarized light with a set rotational direction to pass through the polarizing film layer 70. The anti-reflection layer 80 includes a phase retarder 81 and a linear polarizer 82 which are stacked along a direction away from the base substrate 101 sequentially, wherein the phase retarder 81 is configured to convert the circularly polarized light passing through the polarizing film layer 70 into linearly polarized light, and a polarization direction of the linearly polarized light is parallel to a direction of a light transmission axis of the linear polarizer 82.

In the display substrate according to the embodiment of the present disclosure, the polarizing film layer 70 is provided between the light exiting side of the light emitting element 310 and the anti-reflection layer 80. The polarizing film layer 70 can convert at least a portion of the light which is emitted by the light emitting element 310 and incident onto the polarizing film layer 70 into the circularly polarized light with the set rotational direction to pass through the polarizing film layer 70. The circularly polarized light passing through the polarizing film layer 70 can be converted into linearly polarized light after passing through the phase retarder 81 of the anti-reflection layer 80, and the polarization direction of the linearly polarized light is parallel to the direction of the light transmission axis of the linear polarizer 82 of the anti-reflection layer 80, such that the linearly polarized light can pass through the linear polarizer 82 of the anti-reflection layer 80 almost without loss. Thus, compared with schemes in some techniques in which light emitted by the light emitting element is directly incident onto the anti-reflection layer 80 and passes through the anti-reflection layer 80 without polarization modulation, light loss can be reduced and a light emitting efficiency of the display substrate can be improved, thereby improving luminance of the display substrate and decreasing power consumption.

In some exemplary embodiments, as shown in FIG. 1, the display substrate may include multiple sub-pixels configured to display different colors, and each sub-pixel includes one light emitting element. Sub-pixels of three colors, which are, respectively a red sub-pixel R, a green sub-pixel G and a blue sub-pixel B, are illustrated in FIG. 1. Taking the red sub-pixel R as an example, the light emitting element may include an anode 301, a light emitting layer 3051 and a cathode 309 which are stacked sequentially along a direction away from the base substrate 101. As shown in FIG. 3, the polarizing film layer 70 is further configured to convert another portion of the light which is emitted by the light emitting element 310 and incident onto the polarizing film layer 70 into circularly polarized light with a rotational direction opposite to the set rotational direction and reflect the light. The circularly polarized light with the rotational direction opposite to the set rotational direction reflected off the polarizing film layer 70 is converted into circularly polarized light with the same rotational direction as the set rotational direction after it is reflected off the cathode 309, and can pass through the polarizing film layer 70. Thus, the circularly polarized light reflected off the polarizing film layer 70 can be retrieved through a reflection action of the cathode 309, thereby reducing the light loss and improving the light emitting efficiency. In other implementations, a reflection layer may be disposed at one side of the cathode facing away from the base substrate, and the circularly polarized light reflected off the polarizing film layer is reflected using the reflection layer.

In an example of this embodiment, as shown in FIGS. 1 and 2, the light emitting element 310 may be a top-emission OLED device. The anode 301 of the top-emission OLED device have a composite film layer structure composed of a metal layer with high reflectivity and high work function and a transparent metal oxide layer, such as Ag/ITO (silver/indium tin oxide), Ag/IZO (silver/indium zinc oxide) or ITO/Ag/ITO. The anode 301 may be formed through processes such as magnetron sputtering, etching, etc. The reflectivity of the anode 301 in a visible light region may be greater than 85%, and a square resistance may be less than 12/sq. The cathode 309 may be made of a semi-transparent and semi-reflective metallic material such as magnesium, silver or aluminum, or an alloy material (e.g., magnesium-silver alloy). Transmittance of the cathode 309 in the visible light region may be greater than 40%, and a square resistance may be less than 100/sq. The cathode 309 may be formed by vacuum deposition. Materials of the light emitting layer may include a host material and a fluorescent guest material. In order to improve transmission ability for electrons and holes in the OLED device, taking the red sub-pixel R as an example, a hole injection layer 302, a hole transport layer 303 and an electron block layer 3041 stacked sequentially may be disposed between the anode 301 and the light emitting layer 3051, and a hole block layer 306, an electron transport layer 307 and an electron injection layer 308 stacked sequentially may be disposed between the light emitting layer 3051 and the cathode 309. All film layers between the anode 301 and the cathode 309 may be referred to as organic functional layers 311 (shown in FIG. 3).

In some exemplary embodiments, as shown in FIG. 1, the phase retarder 81 of the anti-reflection layer 80 may be a quarter-wave plate, and an angle between an optical axis direction of the quarter-wave plate and a polarization direction (i.e., the direction of the light transmission axis) of the linear polarizer 82 may be 45° or 135°. The anti-reflection layer 80 may be attached to a surface of the polarizing film layer 70 facing away from the base substrate 101 by an optically clear adhesive (OCA).

In some exemplary embodiments, as shown in FIG. 3, the polarizing film layer 70 may include a cholesteric liquid crystal (CLC) layer, which may be referred to as a chiral nematic liquid crystal layer, having a cured chiral direction (e.g., left-handed direction). The cholesteric liquid crystal layer may be configured to convert a portion (which may be 50%) of natural light within a set wavelength range incident onto the cholesteric liquid crystal layer into circularly polarized light with a rotational direction (e.g., right-handed direction) opposite to its chiral direction to pass through the cholesteric liquid crystal layer, and convert another portion (which may be 50%) of the natural light within the set wavelength range into circularly polarized light with a rotational direction (e.g., left-handed direction) same as its chiral direction and reflect it. The circularly polarized light with the rotational direction (e.g., left-handed direction) same as its chiral direction reflected off the cholesteric liquid crystal layer is reversed in rotational direction (e.g., left-handed direction is reversed to right-handed direction) after it is reflected off the cathode to become circularly polarized light (e.g., right-handed direction) that can pass through the cholesteric liquid crystal layer. Given that reflectivity of the cathode 309 is 50%, more than about 75% of the light emitted by the light emitting element 310 can pass through the cholesteric liquid crystal layer and present a circular polarization property of a fixed rotational direction (e.g., right-handed direction). The circularly polarized light passing through the polarizing film layer 70 is converted into linearly polarized light after passing through the phase retarder 81 of the anti-reflection layer 80, wherein a polarization direction of the linearly polarized light is parallel to the direction of the light transmission axis of the linear polarizer 82 of the anti-reflection layer 80, so that the natural light within the set wavelength range can pass through the anti-reflection layer 80 almost without loss. The cholesteric liquid crystal layer may further be configured such that there is no change in a polarization state of natural light outside the set wavelength range incident onto the cholesteric liquid crystal layer, that is, the natural light outside the set wavelength range is still natural light after it is incident onto and passes through the cholesteric liquid crystal layer. The set wavelength range may be understood as an optical window or reflection band of the cholesteric liquid crystal layer. As shown in FIG. 3, in the display substrate based on some technologies, the light emitted by the light emitting element 310 is still natural light when it is incident onto the anti-reflection layer 80, and the natural light is still natural light after passing through the phase retarder 81 of the anti-reflection layer 80, and then there will be a light loss of about 50% to 55% after the natural light passes through the linear polarizer 82 of the anti-reflection layer 80. Therefore, in the display substrate according to this embodiment, compared with schemes in some techniques in which the light emitted by the light emitting element is directly incident onto the anti-reflection layer 80 and passes through the anti-reflection layer 80 without modulation by polarization, the light loss can be reduced and the light emitting efficiency of the display substrate can be improved, thereby improving the luminance of the display substrate and decreasing the power consumption.

In an example of this embodiment, transmittance of the cholesteric liquid crystal layer to the natural light outside the set wavelength range may be greater than 85%, and reflectivity of the cholesteric liquid crystal layer to the natural light within the set wavelength range may be no less than 30%, for example, no less than 45%.

In an example of this embodiment, the set wavelength range may be 440 nm to 670 nm, and the wavelength range substantially covers wavelength ranges of red light, green light and blue light. Thus, the polarizing film layer can convert red light, green light and blue light respectively emitted by a red light emitting element, a green light emitting element and a blue light emitting element into circularly polarized light, thereby improving the display substrate's light emitting efficiency for the red light, the green light and the blue light. In other implementations, the set wavelength range may include wavelengths of light of a single color (e.g., any one of red, green, and blue) or may include wavelengths of light of two or more colors. For example, the set wavelength range may be 580 nm to 650 nm, thus light in this wavelength range is red light. As shown in FIG. 4, FIG. 4 is a graph of transmittance of a cholesteric liquid crystal (R-CLC) layer operating in the wavelength range of red light to visible light with different wavelengths in a display substrate according to some exemplary embodiments. The cholesteric liquid crystal layer can convert red light in this wavelength range into circularly polarized light to pass through the cholesteric liquid crystal layer (e.g., the transmittance may be 50%), and there is no change in a polarization state of natural light outside this wavelength range, and its transmittance to the natural light outside this wavelength range may be greater than 85%.

In an example of this embodiment, as shown in FIGS. 1 and 2, the display substrate may include multiple sub-pixels configured to display different colors. Only three sub-pixels, which are respectively a red sub-pixel R, a green sub-pixel G, and a blue sub-pixel B, are illustrated in the example of FIGS. 1 and 2. Each sub-pixel includes one light emitting element 310 (shown in FIG. 2). The polarizing film layer is configured to convert natural light emitted by a light emitting element 310 of a sub-pixel of at least one color into circularly polarized light.

As shown in FIGS. 1 and 2, the polarizing film layer 70 may include one cholesteric liquid crystal layer which may include one or more kinds of cholesteric liquid crystals, wherein one kind of cholesteric liquid crystals can convert natural light emitted by a light emitting element 310 of a sub-pixel of one color into circularly polarized light. Alternatively, the polarizing film layer 70 may include multiple stacked cholesteric liquid crystal layers which respectively convert natural light emitted by the light emitting elements 310 of multiple sub-pixels of different colors into circularly polarized light. Illustratively, No, Ne and P of different kinds of cholesteric liquid crystals may be different, wherein No is a refractive index of the cholesteric liquid crystal parallel to an optical axis direction, Ne is a refractive index of the cholesteric liquid crystal perpendicular to the optical axis direction, and P is a pitch of the cholesteric liquid crystal. Different kinds of cholesteric liquid crystals can convert natural light within different wavelength ranges into circularly polarized light.

Illustratively, as shown in FIGS. 1 and 2, the display substrate may include multiple pixel units arranged in an array (one pixel unit may be referred to as one pixel point). Each pixel unit may include sub-pixels of three colors, for example, a red sub-pixel R, a green sub-pixel G and a blue sub-pixel B, multiple sub-pixels of the same color may be referred to as the same kind of sub-pixels, and the light emitting element of the sub-pixel of each color emits light of the color displayed by the sub-pixel, for example, the light emitting element 310 of the red sub-pixel R (which may be referred to as a red light emitting element) emits red light.

In some exemplary embodiments, as shown in FIGS. 1 and 2, the polarizing film layer 70 may be configured to be able to convert natural light emitted by the light emitting element 310 of a sub-pixel of one color into circularly polarized light. Illustratively, the polarizing film layer 70 may include one cholesteric liquid crystal layer, which may include one kind of cholesteric liquid crystals, which can convert natural light emitted by a light emitting element of a sub-pixel of one color into circularly polarized light. For example, the cholesteric liquid crystal layer may be configured to be able to convert red light emitted by the light emitting element 310 of the red sub-pixel R into circularly polarized light, and there is no change in polarization states of green light emitted by the light emitting element 310 of the green sub-pixel G and blue light emitted by the light emitting element 310 of the blue sub-pixel B, that is, the green light emitted by the light emitting element 310 of the green sub-pixel G and the blue light emitted by the light emitting element 310 of the blue sub-pixel B are still green natural light and blue natural light after they are incident onto the cholesteric liquid crystal layer and pass through the cholesteric liquid crystal layer.

In some exemplary embodiments, as shown in FIGS. 1 and 2, the polarizing film layer 70 may be configured to be able to convert natural light emitted by the light emitting elements 310 of the sub-pixels of two or more colors into circularly polarized light. For example, the polarizing film layer 70 may be configured to be able to convert red light emitted by the light emitting element 310 of the red sub-pixel R, green light emitted by the light emitting element

310 of the green sub-pixel G and blue light emitted by the light emitting element 310 of the blue sub-pixel B into circularly polarized light.

Illustratively, the polarizing film layer 70 may include one cholesteric liquid crystal layer, which may be in an integrated structure and cover the sub-pixels of multiple colors (e.g., cover the red sub-pixel R, the green sub-pixel G and the blue sub-pixel B). The cholesteric liquid crystal layer may include three kinds of cholesteric liquid crystals, which can respectively convert red light emitted by the light emitting element 310 of the red sub-pixel R, green light emitted by the light emitting element 310 of the green sub-pixel G and blue light emitted by the light emitting element 310 of the blue sub-pixel B into circularly polarized light.

Alternatively, the polarizing film layer may include one cholesteric liquid crystal layer, which may include a first sub-cholesteric liquid crystal layer, a second sub-cholesteric liquid crystal layer and a third sub-cholesteric liquid crystal layer. The first sub-cholesteric liquid crystal layer is disposed at a light exiting side of the light emitting element of the red sub-pixel R and can convert the red light emitted by the light emitting element of the red sub-pixel R into circularly polarized light, the second sub-cholesteric liquid crystal layer is disposed at a light exiting side of the light emitting element of the green sub-pixel G and can convert the green light emitted by the light emitting element of the green sub-pixel G into circularly polarized light, and the third sub-cholesteric liquid crystal layer is disposed at a light exiting side of the light emitting element of the blue sub-pixel B and can convert the blue light emitted by the light emitting element of the blue sub-pixel B into circularly polarized light.

Alternatively, the polarizing film layer 70 may include three stacked cholesteric liquid crystal layers, and cholesteric liquid crystals in the three cholesteric liquid crystal layers are different. The three cholesteric liquid crystal layers can respectively convert red light emitted by the light emitting element 310 of the red sub-pixel R, green light emitted by the light emitting element 310 of the green sub-pixel G and blue light emitted by the light emitting element 310 of the blue sub-pixel B into circularly polarized light.

In some exemplary embodiments, the cholesteric liquid crystal layer and the light emitting element may satisfy $|Ne-No| \times P \geq FWHM \times 2$, wherein No is a refractive index of the cholesteric liquid crystal parallel to an optical axis direction;

Ne is a refractive index of the cholesteric liquid crystal perpendicular to the optical axis direction;

P is a pitch of the cholesteric liquid crystal; and

FWHM is a peak width at half height of an emission spectrum of the light emitting element.

In this example, the width of the optical window of the cholesteric liquid crystal layer is defined to be no less than twice the peak width at half height of the emission spectrum of the light emitting element of the corresponding color, thus the cholesteric liquid crystal layer can achieve better light modulation effect.

In some exemplary embodiments, the cholesteric liquid crystal layer and the light emitting element may satisfy $|(No+Ne) \times P - 2\lambda| \leq 3 \times FWHM$;

wherein No is the refractive index of the cholesteric liquid crystal parallel to the optical axis direction;

Ne is the refractive index of the cholesteric liquid crystal perpendicular to the optical axis direction;

P is the pitch of the cholesteric liquid crystal;

$\lambda$ is the peak wavelength of the emission spectrum of the light emitting element; and FWHM is the peak width at half height of the emission spectrum of the light emitting element.

In this example, $|(No+Ne) \times P - 2\lambda| \leq 3 \times FWHM$, i.e., $|0.5 \times (No+Ne) \times P - \lambda| \leq 1.5 \times FWHM$, wherein $|0.5 \times (No+Ne) \times P - \lambda|$ represents a difference between a center wavelength of the optical window of the cholesteric liquid crystal layer and a peak wavelength of the emission spectrum of the light emitting element of the corresponding color. The difference is no greater than 1.5 times of the peak width at half height of the emission spectrum of the light emitting element, thus the cholesteric liquid crystal layer can achieve better light modulation effect.

Illustratively, the light emitting element includes a red light emitting element which satisfies FWHM=34 nm and $\lambda$=615 nm. The polarizing film layer includes a cholesteric liquid crystal layer, which includes a first cholesteric liquid crystal (e.g., the optical window is a cholesteric liquid crystal with a red light wavelength range from 580 nm to 650 nm), and the first cholesteric liquid crystal can convert at least a portion of red light emitted by the red light emitting element incident onto the cholesteric liquid crystal layer into circularly polarized light with a set rotational direction to pass through the first cholesteric liquid crystal. The first cholesteric liquid crystal satisfies P=400 nm, Ne=1.62 and No=1.44. In this example, the first cholesteric liquid crystal and the red light emitting element satisfy $|Ne-No| \times P \geq FWHM \times 2$ and $|(No+Ne) \times P - 2\lambda| \leq 3 \times FWHM$.

In some exemplary embodiments, as shown in FIGS. 1 and 2, the light dimming structure layer may further include a composite structure layer 60 disposed at one side of the polarizing film layer 70 facing the light emitting element 310. A refractive index of the composite structure layer 60 increases and decreases alternately along the direction away from the base substrate 101, which is conducive to coupling output of light emitted by the light emitting element 310, thereby improving the light emitting efficiency of the display substrate and further improving the positive viewing angle luminance of the display substrate. In addition, reflection characteristics of the cathode 309 can be also improved to facilitate retrieval of the circularly polarized light reflected off the cholesteric liquid crystal layer, thereby improving the light emitting efficiency of the display substrate.

In an example of this embodiment, the composite structure layer may include n film layers stacked sequentially along the direction away from the base substrate, a farthest film layer away from the base substrate in the composite structure layer is the n-th film layer, wherein n may be an integer greater than or equal to 2.

Illustratively, both a refractive index of the (n−1)-th film layer and a refractive index of the polarizing film layer may be lower than a refractive index of the n-th film layer, or both the refractive index of the (n−1)-th film layer and the refractive index of the polarizing film layer may be higher than the refractive index of the n-th film layer.

Illustratively, the refractive index of one of any two adjacent film layers of the n film layers may be 1.3 to 1.7, and the refractive index of the other film layer may be 1.7 to 2.3.

Illustratively, the refractive index of the polarizing film layer may be 1.3 to 1.7. A refractive index of a film layer of the n film layers which is closest to the base substrate may be 1.7 to 2.3. In an example of this embodiment, the polarizing film layer is a cholesteric liquid crystal layer, an average refractive index of the cholesteric liquid crystal layer is 1.3 to 1.7, wherein the average refractive index of the cholesteric liquid crystal layer is $0.5\times(No+Ne)$.

Illustratively, the composite structure layer may include a first film layer, a second film layer, a third film layer, a fourth film layer and a fifth film layer that are stacked sequentially along the direction away from the base substrate. Refractive indexes of the first film layer, the second film layer, the third film layer, the fourth film layer and the fifth film layer may be 1.7 to 2.3, 1.3 to 1.7, 1.7 to 2.3, 1.3 to 1.7, 1.7 to 2.3, respectively, i.e., the refractive indexes increase and decrease alternately.

A thickness of the first film layer is 50 nm to 150 nm, a thickness of the second film layer is 40 nm to 100 nm, a thickness of the third film layer is 500 nm to 2000 nm, a thickness of the fourth film layer is 5000 nm to 20000 nm, and a thickness of the fifth film layer is 400 nm to 1000 nm. For example, the thickness of the first film layer is 80 nm to 100 nm, the thickness of the second film layer is 50 nm to 70 nm, the thickness of the third film layer is 800 nm to 1200 nm, the thickness of the fourth film layer is 8000 nm to 12000 nm, and the thickness of the fifth film layer is 500 nm to 700 nm. Total transmittance of the composite structure layer to visible light may be no less than 90%.

In some implementations, a material of the first film layer may be an organic material or an inorganic material, for example, it may be a polymer material such as an aromatic amine or azine derivative. The second film layer may be a lithium fluoride layer formed by thermal evaporation or a silicon dioxide layer formed by plasma enhanced chemical vapor deposition (PECVD). The third film layer may be a silicon nitride or silicon oxynitride layer formed by PECVD. The fourth film layer may be formed by first forming a resin material layer by an ink jet printing method and then curing the resin material layer by light or heat, or the fourth film layer may be a silicon dioxide layer formed by PECVD. The fifth film layer may be a silicon nitride or silicon oxynitride layer formed by PECVD. In this example, as shown in FIGS. 1 and 2, the first film layer may be referred to as a capping layer (CPL) 61, and the second, third, fourth and fifth film layers, which may function as encapsulation layers (TFE) 62 of the display substrate, can play a part in preventing external water and oxygen from intruding into the light emitting element. In some other implementations, materials of both the first film layer and the second film layer may be organic materials. For example, the materials of both the first film layer and the second film layer are aromatic amine or azine organic materials (illustratively, the refractive indexes of the first film layer and the second film layer may be adjusted by adjusting differences in molecular structures of organic materials from which the first film layer and the second film layer are formed). A material of the third film layer is silicon nitride or silicon oxynitride, a material of the fourth film layer is a resin material or silicon dioxide, and a material of the fifth film layer is silicon nitride or silicon oxynitride. In this implementation, no lithium fluoride layer is provided in the composite structure layer, and the materials of the first film layer and the second film layer are selected to be organic materials of the same kind, thereby saving processes and reducing process flows. In some other implementations, a material of the first film layer may be an organic material or an inorganic material, for example, it may be a high polymer material such as an aromatic amine or azine derivative. The materials of both the second film layer and the third film layer are silicon nitride or silicon oxynitride (for example, the materials of both the second film layer and the third film layer are silicon oxynitride, and the refractive indexes of the second film layer and the third film layer may be adjusted by adjusting a ratio of nitrogen to oxygen in silicon oxynitride from which the second film layer and the third film layer are formed). A material of the fourth film layer is a resin material or silicon dioxide, and a material of the fifth film layer is silicon nitride or silicon oxynitride. In this implementation, no lithium fluoride layer is provided in the composite structure layer, and the materials of the first film layer and the second film layer are selected to be organic materials of the same kind, thereby saving processes and reducing process flows.

In some exemplary embodiments, as shown in FIGS. 1 and 2, a thickness of the polarizing film layer 70 may be 1 μm to 10 μm. The polarizing film layer 70 may be formed directly on a surface of the composite structure layer 60 facing away from the base substrate 101, or the polarizing film layer 70 may be attached to the surface of the composite structure layer 60 facing away from the base substrate 101 by an optically clear adhesive. A thickness of the optically clear adhesive may be 15 μm to 40 μm, and a difference between a refractive index of the optically clear adhesive and the refractive index of the polarizing film layer 70 may be no greater than 0.15, thus loss of light when passing through the optically clear adhesive can be reduced.

In an example of this embodiment, the polarizing film layer may be a cholesteric liquid crystal layer. A mixture of a nematic liquid crystal monomer with photopolymerization properties and a chiral agent may be coated on the surface of the composite structure layer facing away from the base substrate, and then a polymer stabilized cholesteric liquid crystal layer with a fixed rotational direction is formed by light curing, so as to form the polarizing film layer; or a polymer liquid crystal material with determined chiral characteristics can be coated directly on the surface of the composite structure layer facing away from the base substrate, so as to form the polarizing film layer. Alternatively, a cholesteric liquid crystal film manufactured in advance may be attached to the surface of the composite structure layer facing away from the base substrate through an optically clear adhesive, so as to form the polarizing film layer.

In some exemplary embodiments, as shown in FIGS. 1 and 2, the display substrate further includes an encapsulation layer 62, the composite structure layer 60 may include the encapsulation layer 62. Alternatively, in other implementations, the encapsulation layer may be disposed between the polarizing film layer 70 and the anti-reflection layer 80, or the encapsulation layer may be disposed at one side of the anti-reflection layer 80 facing away from the base substrate 101. The encapsulation layer may include multiple stacked inorganic material film layers, or the encapsulation layer may include an inorganic material layers, an organic material layers and an inorganic material layer which are stacked, and the encapsulation layer may play a part in preventing external water and oxygen from intruding into the light emitting element. In an example of this embodiment, the second film layer, the third film layer, the fourth film layer and the fifth film layer of the composite structure layer may function as the encapsulation layer of the display substrate.

In some exemplary embodiments, the polarizing film layer includes one cholesteric liquid crystal layer, which, as shown in FIG. 4, can convert red light within a wavelength range from 580 nm to 650 nm (the transmittance of which is about 50%) into circularly polarized light with a set rotational direction, and there is no change in a polarization state of natural light outside the wavelength range from 580 nm to 650 nm (the transmittance of which is more than 85%).

The cholesteric liquid crystal layer of this embodiment operates in the red light wavelength range from 580 nm to 650 nm, and a cholesteric liquid crystal of the cholesteric liquid crystal layer of this embodiment may be represented by R-CLC, wherein a pitch P of the R-CLC is 400 nm, the refractive index Ne perpendicular to the optical axis direction is 1.62, and the refractive index No parallel to the optical axis direction is 1.44. The FWHM of the emission spectrum of an OLED light emitting element of the red sub-pixel (R-OLED) is 34 nm, and the peak wavelength $\lambda$ is 615 nm. Then, R-CLC and R-OLED satisfy $|Ne-No| \times P \geq FWHM \times 2$ and $|(No+Ne) \times P - 2\lambda| \leq 3 \times FWHM$.

Luminance of three different devices at a fixed current density is compared, as shown in Table 1.

TABLE 1

|  | At fixed current density | Luminance of Device |
| --- | --- | --- |
| Contrastive Example 1 | R-OLED/glass | 490 nits |
| Contrastive Example 2 | R-OLED/glass/AR | 209 nits |
| Embodiment | R-OLED/CPL/TFE/R-CLC/AR | 268 nits |

In Table 1, R-OLED is a red OLED light emitting element, glass is a cover glass, AR is an anti-reflection layer in the embodiment of the present disclosure, R-CLC is a cholesteric liquid crystal operating in the red light wavelength range from 580 nm to 650 nm, and CPL and TFE are a capping layer and an encapsulation layer of the composite structure layer having five film layers in the previous embodiment. It may be seen from Table 1 that the luminance of the device of this embodiment is higher than that of the device of Contrastive Example 2 when the anti-reflection layer is attached.

In some exemplary embodiments, the polarizing film layer includes one cholesteric liquid crystal layer, wherein the cholesteric liquid crystal layer may include three kinds of cholesteric liquid crystals, which are R-CLC, G-CLC and B-CLC respectively. Illustratively, the R-CLC operates in the red light wavelength range form 580 nm to 650 nm, the G-CLC operates in a green light wavelength range from 500 nm to 560 nm, and the B-CLC operates in a blue light wavelength range from 430 nm to 490 nm, thus the R-CLC and the light emitting element of the red sub-pixel satisfy $|Ne-No| \times P \geq FWHM \times 2$ and $|(No+Ne) \times P - 2\lambda| \leq 3 \times FWHM$; the G-CLC and the light emitting element of the green sub-pixel satisfy $|Ne-No| \times P \geq FWHM \times 2$ and $|(No+Ne) \times P - 2\lambda| \leq 3 \times FWHM$; the B-CLC and the light emitting element of the blue sub-pixel satisfy $|Ne-No| \times P \geq FWHM \times 2$ and $|(No+Ne) \times P - 2\lambda| \leq 3 \times FWHM$. The reflectivity of the cholesteric liquid crystal layer to light within the wavelength range from 440 nm to 670 nm may be greater than 30%.

In other implementations, the polarizing film layer may include three stacked cholesteric liquid crystal layers, which are a first cholesteric liquid crystal layer, a second cholesteric liquid crystal layer and a third cholesteric liquid crystal layer, respectively. A cholesteric liquid crystal of the first cholesteric liquid crystal layer is the R-CLC, a cholesteric liquid crystal of the second cholesteric liquid crystal layer is the G-CLC, and a cholesteric liquid crystal of the third cholesteric liquid crystal layer is the B-CLC.

Power consumption of display substrates of four different embodiments at luminance of 800 nits with an all-white picture (0.31, 0.32) is compared below, as shown in Table 2.

TABLE 2

|  | Kind of liquid crystal of polarizing film layer | Power consumption before use | Power consumption after use |
| --- | --- | --- | --- |
| Embodiment 1 | B-CLC | 100% | 92% |
| Embodiment 2 | G-CLC | 100% | 92% |
| Embodiment 3 | R-CLC | 100% | 94% |
| Embodiment 4 | B-CLC/G-CLC/R-CLC | 100% | 80% |

In Table 2, the polarizing film layer of Embodiment 1 includes a B-CLC layer, which can only convert blue light within the wavelength range from 430 nm to 490 nm into circularly polarized light, the polarizing film layer of Embodiment 2 includes a G-CLC layer, which can only convert green light within the wavelength range from 500 nm to 560 nm into circularly polarized light, the polarizing film layer of Embodiment 3 includes an R-CLC layer, which can only convert red light within the wavelength range from 580 nm to 650 nm into circularly polarized light, and the polarizing film layer of Embodiment 4 includes stacked B-CLC layer/G-CLC layer/R-CLC layer, which can convert red light, green light and blue light within the wavelength range from 440 nm to 670 nm into circularly polarized light. It may be seen that the power consumption of the display substrate can be decreased in Embodiments 1 to 4, and the power consumption of the display substrate can be decreased to a greater extent in Embodiment 4.

In some exemplary embodiments, the polarizing film layer may be attached to the surface of the composite structure layer facing away from the base substrate by an optically clear adhesive. A thickness of the optically clear adhesive may be 15 μm to 40 μm, thus the loss of light when passing through the optically clear adhesive can be reduced, and the positive viewing angle luminance of the display substrate can be improved.

Figure 5A:
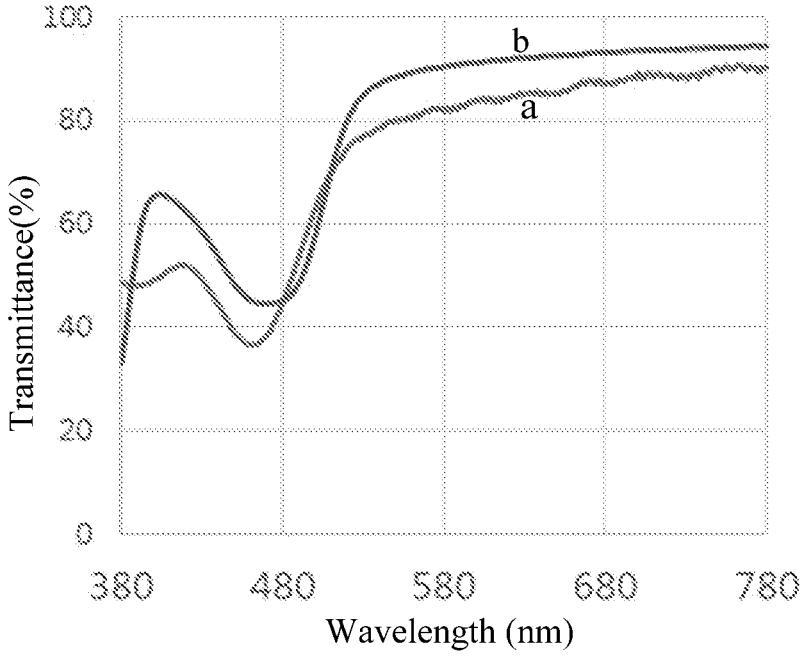
FIG. 5a is a curve graph of transmittance of some film layer structures without anti-reflection layers.
Figure 5B:
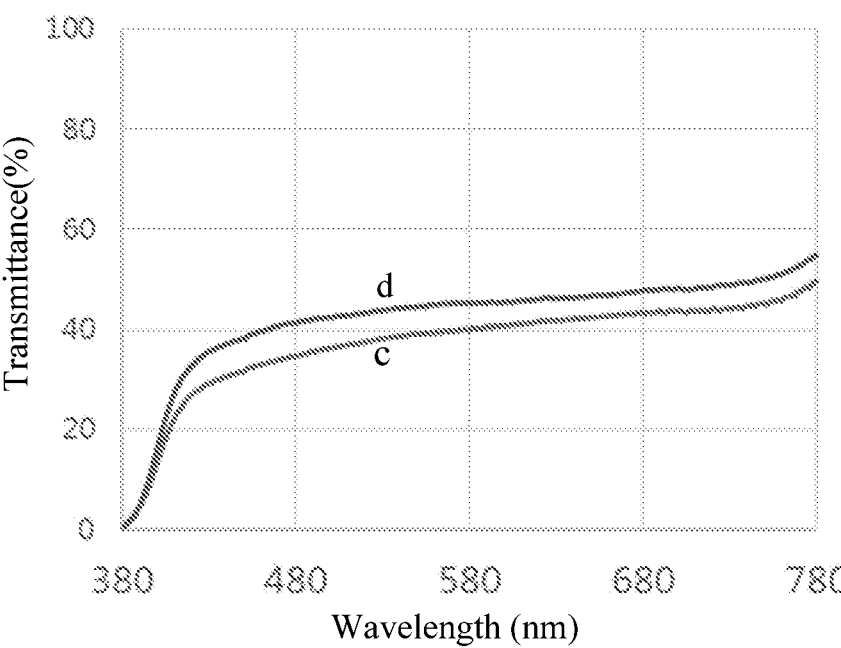
FIG. 5b is a curve graph of transmittance of some film layer structures with anti-reflection layers.

The influence of the optically clear adhesive of different thicknesses on the transmittance of the film layer is compared below. As shown in FIG. 5a, FIG. 5a is a curve graph of transmittance of some film layer structures without anti-reflection layers. A cholesteric liquid crystal layer is attached to a glass substrate using an optically clear adhesive of 10 μm to obtain film layer structure 1, a cholesteric liquid crystal layer is attached to the glass substrate using an optically clear adhesive of 25 μm to obtain film layer structure 2, curve a represents a transmittance curve of film layer structure 1, and curve b represents a transmittance curve of film layer structure 2. It may be seen that the optically clear adhesive of different thicknesses has obvious influence on the transmittance of the film layer. When the thickness of the optically clear adhesive is 25 μm, the film layer structure has higher transmittance (lower optical loss). As shown in FIG. 5b, FIG. 5b is a curve graph of transmittance of some film layer structures with anti-reflection layers. An anti-reflection layer is attached to one side of the cholesteric liquid crystal layer of film layer structure 1 facing away from the glass substrate to obtain film layer structure 3, an anti-reflection layer is attached to one side of the cholesteric liquid crystal layer of film layer structure 2 facing away from the glass substrate to obtain film layer structure 4, curve c represents a transmittance curve of film layer structure 3, and curve d represents a transmittance curve of film layer structure 4. It may be seen that the optically clear adhesive of different thicknesses has obvious influence on the transmittance of the film layer. When the thickness of the optically clear adhesive is 25 μm, the film layer structure has higher transmittance, and because film layer structure 3 and film layer structure 4 include anti-reflection layers, they have good anti-reflection effect.

Positive viewing angle luminance of devices of different embodiments in cases of optically clear adhesive of different thicknesses is compared below, as shown in Table 3.

TABLE 3

|  | Device structure | Positive viewing angle luminance |
| --- | --- | --- |
| Contrastive Example 1 | B-OLED/CPL/TFE | 100% |
| Contrastive Example 2 | B-OLED/CPL/TEF/AR | 41% |
| Embodiment 1 | B-OLED/CPL/TFE/OCA(10 μm)/B-CLC/AR | 47% |
| Embodiment 2 | B-OLED/CPL/TFE/OCA(25 μm)/B-CLC/AR | 53% |
| Embodiment 3 | B-OLED/CPL/TFE/OCA(30 μm)/B-CLC/AR | 49% |
| Embodiment 4 | B-OLED/CPL/TFE/OCA(50 μm)/B-CLC/AR | 36% |

In Table 3, taking the positive viewing angle luminance of the device of Contrastive Example 1 as a basis, compared with the devices of Embodiments 1 to 4, a B-CLC layer is not provided in the device of Contrastive Example 2. It may be seen that when the thickness of the optically clear adhesive is 10 μm to 30 μm, the positive viewing angle luminance of the devices of Embodiments 1 to 3 is higher than that of the device of Contrastive Example 2, and when the thickness of the optically clear adhesive is increased to 50 μm, the positive viewing angle luminance of the device of Embodiment 4 is lower than that of the device of Contrastive Example 2. Therefore, when the thickness of the optically clear adhesive is 10 μm to 30 μm, optical output characteristics of the device can be improved, the luminance of the device can be improved, and the loss can be decreased.

In some exemplary embodiments, frontal reflectivity and positive viewing angle luminance of different devices in cases of different encapsulation layer structures are compared, as shown in Table 4.

TABLE 4

|  | Device structure | Frontal reflectivity @ 520 nm | Luminance at positive viewing angle |
| --- | --- | --- | --- |
| Contrastive Example 1 | G-OLED/CPL/Glass | 47% | 100% |
| Contrastive Example 2 | G-OLED/CPL/Glass/G-CLC/AR | / | 69% |
| Contrastive Example 3 | G-OLED/CPL/TFE | 54% | 98% |
| Embodiment 1 | G-OLED/CPL/TFE/G-CLC/AR | / | 74% |

In Table 4, the devices of both Contrastive Example 1 and Contrastive Example 2 are in the form of glass encapsulation. Both the device of Contrastive Example 3 and the device of Embodiment 1 are in the form of thin film encapsulation, and a thin film encapsulation layer is the encapsulation layer (TFE) of the composite structure layer having five film layers in the previous embodiment. G-CLC and AR are provided in the devices of both Contrastive Example 2 and Embodiment 1. By comparing the frontal reflectivity of the devices of Contrastive Example 1 and Contrastive Example 3, it may be seen that the frontal reflectivity of the device using the composite structure layer including the encapsulation layer of the embodiment of the present disclosure can be improved compared with the device using the glass encapsulation. By comparing the positive viewing angle luminance of the devices of Contrastive Example 2 and Example 1, it may be seen that the positive viewing angle luminance of the device having the composite structure layer including the encapsulation layer of the embodiment of the present disclosure can be improved compared with the device having the glass encapsulation. It follows that the front reflectivity of the device having the encapsulation layer of the composite structure layer in the embodiment of the present disclosure can be improved compared with the device having the glass encapsulation, thereby improving a light collection efficiency of the CLC layer and improving the positive viewing angle luminance of the device.

In experiments in Tables 1 to 4 above, CLC layers are formed by OCA bonding, and film layer parameters involved in the experiments are shown in Table 5.

TABLE 5

| Name of film layer | | Material | Refractive index | Thickness |
| --- | --- | --- | --- | --- |
| Composite structure | First film layer | / | 1.7 to 2.3 | 50 nm to 150 nm |

TABLE 5-continued

| Name of film layer | | Material | Refractive index | Thickness |
| --- | --- | --- | --- | --- |
| layer | Second film layer | Lithium fluoride | 1.41 | 65 nm |
|  | Third film layer | Silicon oxynitride | 1.73 | 980 nm |
|  | Fourth film layer | Light curing resin | 1.55 | 11000 nm |
|  | Fifth film layer | Silicon nitride | 1.82 | 550 nm |
|  | OCA adhesive | / | 1.47 | 25000 nm |
|  | R-CLC layer, G-CLC layer | Polymer stabilized | 1.4 to 1.7 | 6000 nm to 8000 nm |

TABLE 5-continued

| Name of film layer | Material | Refractive index | Thickness |
|---|---|---|---|
| or B-CLC Layer | cholesteric liquid crystal | | |
| Composite film formed by R-CLC layer, G-CLC layer and B-CLC layer | / | 1.5 | 20000 nm |

In some exemplary embodiments, as shown in FIGS. 1 and 2, the display substrate includes a driving circuit layer 102, a light emitting structure layer 103, a light dimming structure layer, and an anti-reflection layer 80 that are stacked sequentially on a base substrate 101. The driving circuit layer 102 includes multiple pixel driving circuits, and the light emitting structure layer 103 includes multiple light emitting elements 310, each of the light emitting elements 310 is connected to a corresponding one of the pixel driving circuits. The display substrate may include multiple pixel units arranged in an array, each pixel unit may include sub-pixels of multiple colors, multiple sub-pixels of the same color may be referred to as the same kind of sub-pixels, and each sub-pixel includes one light emitting element 310. Illustratively, the light emitting elements 310 are top-emission OLED devices, and each pixel unit includes sub-pixels of three colors, for example, a red sub-pixel R, a green sub-pixel G, and a blue sub-pixel B. The light emitting element 310 of the sub-pixel of each color emits light of the color displayed by the sub-pixel, for example, the light emitting element 310 of the red sub-pixel R (which may be referred to as a red light emitting element) emits red light.

In some exemplary implementations, the base substrate 101 may be made of glass, transparent polyimide or other rigid or flexible base materials, and may have a refractive index of 1.3 to 1.5.

In some exemplary implementations, as illustrated in FIG. 2, the driving circuit layer 102 may include multiple transistors and a storage capacitor forming a pixel driving circuit. FIG. 2 is illustrated by taking each pixel driving circuit including one driving transistor 210 and one storage capacitor 211 as an example. In some implementations, the driving circuit layer 102 may include: a first insulating layer disposed on the base substrate 101; an active layer disposed on the first insulating layer; a second insulating layer covering the active layer; a gate electrode and a first capacitor electrode disposed on the second insulating layer; a third insulating layer covering the gate electrode and the first capacitor electrode; a second capacitor electrode disposed on the third insulating layer; a fourth insulating layer covering the second capacitor electrode, via holes being provided in the second insulating layer, the third insulating layer and the fourth insulating layer, with the via holes exposing the active layer; a source electrode and a drain electrode disposed on the fourth insulating layer, with the source electrode and the drain electrode being respectively connected to the active layer through corresponding via holes; and a planarization layer covering the aforementioned structures, and a via hole which exposes the drain electrode is provided in the planarization layer. The active layer, the gate electrode, the source electrode and the drain electrode form the driving transistor 210, and the first capacitor electrode and the second capacitor electrode form the storage capacitor 211.

In some exemplary implementations, as shown in FIGS. 1 and 2, the light emitting structure layer 103 may include an anode 301, a pixel definition layer 510, a cathode 309 and an organic functional layer located between the anode 301 and the cathode 309. The organic functional layer includes at least light emitting layers (a light emitting layer of the red sub-pixel R is 3051, a light emitting layer of the green sub-pixel G is 3052, and a light emitting layer of the blue sub-pixel B is 3053 in the examples of FIGS. 1 and 2). The organic functional layer may further include a hole injection layer 302, a hole transport layer 303, electron block layers (an electron block layer of the red sub-pixel R is 3041, an electron block layer of the green sub-pixel G is 3042, and an electron block layer of the blue sub-pixel B is 3043 in the examples of FIGS. 1 and 2), a hole block layer 306, an electron transport layer 307 and an electron injection layer 308. The anode 301 is disposed on the planarization layer of the driving circuit layer 102, and is connected to the drain electrode of the driving transistor 210 through a via hole provided in the planarization layer. The pixel definition layer 510 is disposed at one side of the anode 301 facing away from the base substrate 101, and a pixel opening is provided in the pixel definition layer 510. The pixel definition layer 510 covers a portion of a surface of the anode 301 close to a circumferential edge, and the pixel opening exposes the remaining portion of the surface of the anode 301. Multiple film layers of the organic functional layer and the cathode 309 are stacked sequentially on the portion of the surface of the anode 301 exposed by the pixel opening. The anode 301, the organic functional layer and the cathode 303 of each sub-pixel form an OLED device 310 (light emitting element), which is configured to emit light of a corresponding color under driving of the corresponding pixel driving circuit. The light emitting structure layer 103 may further include other film layers, such as spacers pillars disposed on the pixel definition layer 510.

In some exemplary implementations, as shown in FIGS. 1 and 2, the display substrate including the OLED device may be manufactured using the following manufacturing method. First, the driving circuit layer 102 is formed on the base substrate through a patterning process. The driving circuit layer 102 may include the driving transistor 210 and the storage capacitor 211 forming the pixel driving circuit. Then, the planarization layer is formed on the base substrate on which the aforementioned structures are formed, and a via hole exposing the drain electrode of the driving transistor 210 is formed on the planarization layer. Then, multiple anode 301 are formed through a patterning process on the base substrate on which the aforementioned structures are formed, and the anode 301 of each sub-pixel is connected to the drain electrode of the driving transistor 210 of the corresponding pixel driving circuit through a via hole in the planarization layer. Then, the pixel definition layer 510 is formed through a patterning process on the base substrate on which the aforementioned structures are formed, and the pixel opening exposing the anode 301 is formed in the pixel definition layer 510 of each sub-pixel, wherein each pixel opening is used as a light emitting area of the corresponding sub-pixel. Then, on the base substrate on which the aforementioned structures are formed, the hole injection layer 302 and the hole transport layer 303 are coated by evaporation subsequently using an open mask. The hole injection layer 302 and the hole transport layer 303 are jointly connected layers, that is, the hole injection layers 302 of all sub-pixels are connected as a whole, and the hole transport layers 303 of all sub-pixels are connected as a whole. The hole injection layers 302 and the hole transport layers 303 have approximately same area, but different thicknesses. Then, the electron block layer 3041 and the light emitting layer 3051 of the red sub-pixel R, the electron block layer 3042 and the light emitting layer 3052 of the green sub-pixel G and the electron block layer 3043 and the light emitting layer 3053 of the blue sub-pixel B are coated by evaporation respectively in the red sub-pixel R, the green sub-pixel G and the blue sub-pixel B using a fine metal mask. The electron block layers and the light emitting layers of adjacent sub-pixels may overlap slightly with or be isolated from each other. Then, the hole block layer 306, the electron transport layer 307, the electron injection layer 308 and the cathode 309 are coated by evaporation sequentially using an open mask. The hole block layer 306, the electron transport layer 307, the electron injection layer 308 and the cathode 309 are all jointly connected layers, that is, the hole block layers 306 of all sub-pixels are connected as a whole, the electron transport layers 307 of all sub-pixels are connected as a whole, the electron injection layers 308 of all sub-pixels are connected as a whole, and the cathodes 309 of all sub-pixels are connected as a whole.

In some exemplary implementations, the light emitting layer may be coated by evaporation in a multi-source co-evaporation manner to form the light emitting layer containing a host material and a dopant material, wherein the dopant material may be a fluorescent luminescent material. A doping concentration of the dopant material may be regulated and controlled by controlling an evaporation rate of the dopant material or by controlling a ratio of an evaporation rate of the host material to that of the dopant material.

In some exemplary implementations, a material of the hole injection layer may be a P-type doped hole transport material (e.g., the hole injection layer is formed by a carbazole-type material doped with a P-type dopant), and a doping ratio may be about 1%. For example, $MoO_3$ (molybdenum trioxide) is doped into TAPC (4,4'-cyclohexyliden-ebis[N,N-bis(4-methylphenyl)aniline]), that is, TAPC: $MoO_3$. The electron injection layer may decrease an injection potential barrier of holes from the anode and improve a hole injection efficiency. A thickness of the hole injection layer may be 5 nm to 20 nm.

Illustratively, a material of the hole transport layer may be a carbazole-type material or the like with good hole transport characteristics. A length of a microcavity of a blue OLED device can be adjusted by adjusting the thickness of the hole transport layer, so as to adjust color coordinates of blue light. The function of the hole transport layer is to improve the hole transport rate, and also to decrease the hole injection potential barrier and improve the hole injection efficiency.

Illustratively, the electron block layer has a function of exciton blocking and a material of the electron block layer may be a carbazole-type material. The electron block layer of the sub-pixel of each color may be manufactured by evaporation process alone, and a thickness of the electron block layer of the blue sub-pixel may be 5 nm to 10 nm. A length of a microcavity of a green OLED device may be adjusted by adjusting a thickness of the electron block layer of the green sub-pixel, so as to adjust color coordinates of green light. A length of a microcavity of a red OLED device may be adjusted by adjusting a thickness of the electron block layer of the red sub-pixel, so as to adjust color coordinates of red light.

Illustratively, the light emitting layer may include a host material responsible for charge transport and a guest material responsible for emitting light, and the color of the emitted light and the spectral characteristics of the light emitting layer are mainly determined by the guest material. Alternatively, the material of the light emitting layer may be a delayed fluorescence material system, and the material of the light emitting layer may further include a sensitizer having delayed fluorescence characteristics. The light emitting layer of the sub-pixel of each color may be manufactured using the evaporation process alone.

Illustratively, materials of the hole block layer and the electron transport layer may be derivatives such as azine, imidazole, etc. The hole block layer can prevent holes and excitons in the light emitting layer from migrating towards one side where the cathode is located, thereby improving the light emitting efficiency. The electron transport layer can improve the electron transport rate.

Illustratively, a material of an electron injection layer may be 8-hydroxyquinoline lithium (Liq), lithium fluoride (LiF), lithium (Li), ytterbium (Yb), magnesium (Mg) or calcium (Ca). The thickness of the electron inject layer may be less than 2 nm. The electron injection layer may decrease the electron injection potential barrier and improve the electron injection efficiency.

An embodiment of the present disclosure further provides a display device, which includes the display substrate according to any one of the previous embodiments. The display device may be any product or component with a display function, such as a mobile phone, a tablet computer, a television, a display, a laptop computer, a digital photo frame, a navigator, etc.

Sometimes for the sake of clarity, a size of a constituent element, a thickness of a layer or a region in the drawings may be exaggerated. Therefore, one implementation of the present disclosure is not necessarily limited to the size, and the shape and size of each component in the drawings do not reflect the actual scale. In addition, the drawings schematically illustrate some examples, and one implementation of the present disclosure is not limited to the shapes or numerical values shown in the drawings.

In the description herein, "parallel" refers to a state in which an angle formed by two straight lines is above $-10°$ and below $10°$, and thus also includes a state in which the angle is above $-5°$ and below $5°$. In addition, "vertical" refers to a state in which an angle formed by two straight lines is above $80°$ and below $100°$, and thus also includes a state in which the angle is above $85°$ and below $95°$.

In the description herein, orientation or position relationships indicated by the terms such as "upper", "lower", "left", "right", "top", "inside", "outside", "axial", "tetragonal" and the like are orientation or position relationships shown in the drawings, and are intended to facilitate description of the embodiments of the present disclosure and simplification of the description, but not to indicate or imply that the mentioned structure has a specific orientation or be constructed and operated in a specific orientation, therefore, they should not be understood as limitations on the present disclosure.

In the description herein, unless otherwise specified and defined explicitly, the terms "connection", "fixed connection", "installation" and "assembly" should be understood in a broad sense, and, for example, may be a fixed connection, a detachable connection or an integrated connection; the terms "installation", "connection" and "fixed connection" may be a direct connection, an indirect connection through intermediate components, or communication inside two components. For those ordinarily skilled in the art, meanings of the above terms in the embodiments of the present disclosure can be understood according to situations.

The invention claimed is:

1. A display substrate, comprising a light emitting element disposed on a base substrate, and a light dimming structure layer and an anti-reflection layer sequentially stacked at a light exiting side of the light emitting element, wherein the light dimming structure layer comprises a polarizing film layer configured to convert at least a portion of light which is emitted by the light emitting element and incident onto the polarizing film layer into circularly polarized light with a set rotational direction to pass through the polarizing film layer and a composite structure layer disposed at one side of the polarizing film layer facing the light emitting element, wherein the composite structure layer comprises a capping layer and an encapsulation layer; and the anti-reflection layer comprises a phase retarder and a linear polarizer which are stacked sequentially along a direction away from the base substrate, wherein the phase retarder is configured to convert the circularly polarized light passing through the polarizing film layer into linearly polarized light, a polarization direction of the linearly polarized light is parallel to a direction of a light transmission axis of the linear polarizer, wherein the polarizing film layer comprises a cholesteric liquid crystal layer, and the cholesteric liquid crystal layer and the light emitting element satisfy $|Ne-No| \times P \geq FWHM \times 2$ and $|(No+Ne) \times P-2\lambda| \leq 3 \times FWHM$, wherein No is a refractive index of cholesteric liquid crystal parallel to an optical axis direction;

Ne is a refractive index of the cholesteric liquid crystal perpendicular to the optical axis direction;

P is a pitch of the cholesteric liquid crystal;

$\lambda$ is the peak wavelength of the emission spectrum of the light emitting element; and FWHM is a peak width at half height of an emission spectrum of the light emitting element.

2. The display substrate according to claim 1, wherein the light emitting element comprises an anode, a light emitting layer and a cathode which are stacked sequentially along the direction away from the base substrate; and the polarizing film layer is further configured to convert another portion of the light which is emitted by the light emitting element and incident onto the polarizing film layer into circularly polarized light with a rotational direction opposite to the set rotational direction and reflect the light, and the circularly polarized light with the rotational direction opposite to the set rotational direction reflected off the polarizing film layer is converted into circularly polarized light with a same rotational direction as the set rotational direction after it is reflected off the cathode, and the circularly polarized light with the same rotational direction as the set rotational direction is able to pass through the polarizing film layer.

3. The display substrate according to claim 1, wherein the light emitting element comprises a red light emitting element which satisfies FWHM=34 nm and $\lambda$=615 nm; and the cholesteric liquid crystal layer comprises a first cholesteric liquid crystal which is able to convert at least a portion of red light which is emitted by the red light emitting element and incident onto the cholesteric liquid crystal layer into circularly polarized light with the set rotational direction to pass through the cholesteric liquid crystal layer, and the first cholesteric liquid crystal satisfies P=400 nm, Ne=1.62 and No=1.44.

4. The display substrate according to claim 1, wherein a refractive index of the composite structure layer increases and decreases alternately along the direction away from the base substrate.

5. The display substrate according to claim 4, wherein the composite structure layer comprises n film layers stacked sequentially along the direction away from the base substrate, and a farthest film layer away from the base substrate in the composite structure layer is the n-th film layer, with n being an integer greater than or equal to 2; and both a refractive index of the (n−1)-th film layer and a refractive index of the polarizing film layer are lower than a refractive index of the n-th film layer, or both the refractive index of the (n−1)-th film layer and the refractive index of the polarizing film layer are higher than the refractive index of the n-th film layer.

6. The display substrate according to claim 4, wherein the composite structure layer comprises n film layers stacked sequentially along the direction away from the base substrate, with n being an integer greater than or equal to 2; and a refractive index of one of any two adjacent film layers of the n film layers is 1.3 to 1.7, and a refractive index of the other one of the two adjacent film layers is 1.7 to 2.3.

7. The display substrate according to claim 6, wherein a refractive index of the polarizing film layer is 1.3 to 1.7.

8. The display substrate according to claim 6, wherein a refractive index of a film layer of the n film layers which is closest to the base substrate is 1.7 to 2.3.

9. The display substrate according to claim 4, wherein the composite structure layer comprises a first film layer, a second film layer, a third film layer, a fourth film layer and a fifth film layer that are stacked sequentially along the direction away from the base substrate; and a thickness of the first film layer is 50 nm to 150 nm, a thickness of the second film layer is 40 nm to 100 nm, a thickness of the third film layer is 500 nm to 2000 nm, a thickness of the fourth film layer is 5000 nm to 20000 nm, and a thickness of the fifth film layer is 400 nm to 1000 nm.

10. The display substrate according to claim 4, wherein the composite structure layer comprises a first film layer, a second film layer, a third film layer, a fourth film layer and a fifth film layer that are stacked sequentially along the direction away from the base substrate; and a material of the first film layer is an aromatic amine or azine organic material, a material of the second film layer is lithium fluoride or silicon dioxide, a material of the third film layer is silicon nitride or silicon oxynitride, a material of the fourth film layer is a resin material or silicon dioxide, and a material of the fifth film layer is silicon nitride or silicon oxynitride; or materials of both the first film layer and the second film layer are aromatic amine or azine organic material, a material of the third film layer is silicon nitride or silicon oxynitride, a material of the fourth film layer is a resin material or silicon dioxide, and a material of the fifth film layer is silicon nitride or silicon oxynitride; or a material of the first film layer is an aromatic amine or azine organic material, materials of both the second film layer and the third film layer are silicon nitride or silicon oxynitride, a material of the fourth film layer is a resin material or silicon dioxide, and a material of the fifth film layer is silicon nitride or silicon oxynitride.

11. The display substrate according to claim 9, wherein a thickness of the polarizing film layer is 1 μm to 10 μm.

12. The display substrate according to claim 4, wherein the polarizing film layer is attached to the surface of the composite structure layer facing away from the base substrate by an optically clear adhesive, a thickness of the optically clear adhesive is 10 μm to 30 μm, and a difference between a refractive index of the optically clear adhesive and a refractive index of the polarizing film layer is no greater than 0.15.

13. The display substrate according to claim 2, wherein reflectivity of the cholesteric liquid crystal layer to natural light within a set wavelength range is no less than 30%, and transmittance of the cholesteric liquid crystal layer to natural light outside the set wavelength range is greater than 85%.

14. The display substrate according to claim 1, comprising a plurality of sub-pixels configured to display different colors, each sub-pixel comprising one light emitting element;

wherein the polarizing film layer is configured to be able to convert natural light emitted by the light emitting element of a sub-pixel of at least one color into circularly polarized light; or the polarizing film layer comprises a cholesteric liquid crystal layer which comprises one or more kinds of cholesteric liquid crystals, and one kind of cholesteric liquid crystal is able to convert natural light emitted by the light emitting element of a sub-pixel of one color into circularly polarized light; or the polarizing film layer comprises a plurality of stacked cholesteric liquid crystal layers which respectively convert natural light emitted by the light emitting elements of a plurality of sub-pixels of different colors into circularly polarized light.

15. The display substrate according to claim 13, wherein the set wavelength range is from 440 nm to 670 nm.

16. The display substrate according to claim 4, further comprising an encapsulation layer, wherein the composite structure layer comprises the encapsulation layer, or the encapsulation layer is disposed between the polarizing film layer and the anti-reflection layer, or the encapsulation layer is disposed at one side of the anti-reflection layer facing away from the base substrate.

17. A display device comprising the display substrate according to claim 1.

* * * * *